United States Patent
Hung et al.

(10) Patent No.: US 7,626,867 B2
(45) Date of Patent: Dec. 1, 2009

(54) METHOD FOR ACCESSING MEMORY BY WAY OF STEP-INCREASING THRESHOLD VOLTAGE

(75) Inventors: Chun-Hsiung Hung, Hsinchu (TW); Wen-Chiao Ho, Tainan County (TW); Kuen-Long Chang, Taipei (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 12/174,115

(22) Filed: Jul. 16, 2008

(65) Prior Publication Data

US 2008/0304337 A1   Dec. 11, 2008

Related U.S. Application Data

(62) Division of application No. 11/758,802, filed on Jun. 6, 2007.

(51) Int. Cl.
*G11C 16/04* (2006.01)
(52) U.S. Cl. ............................. 365/185.18; 365/185.03
(58) Field of Classification Search ............ 365/185.03, 365/185.18
See application file for complete search history.

(56) References Cited

U.S. PATENT DOCUMENTS 7,002,848 B2 * 2/2006 Takase et al. .......... 365/185.28

* cited by examiner

*Primary Examiner*—Huan Hoang
*Assistant Examiner*—Kretelia Graham
(74) *Attorney, Agent, or Firm*—Thomas, Kayden, Horstemeyer & Risley

(57) ABSTRACT

A method for accessing memory is provided. The memory includes many multi-level cells each having at least a storage capable of storing 2n bits, n is a positive integer. The method for accessing memory includes the following steps: Firstly, threshold voltages of the storage are defined into $2^n$ level respectively, wherein each of the $2^n$ level corresponds to a storage status of n bits, and most significant bits of the storage statuses which level 0 to level $2^{n/2}-1$ correspond to are different from most significant bits of the storage statuses which level $2^{n/2}$ to level $2^n-1$ correspond to. Next, a target data is divided into n portions and the divided target data is written into n temporary memories respectively. Then, n bits of the target data are written into the multi-level cell. Each of the n bits data is collected from each of the n temporary memories.

2 Claims, 6 Drawing Sheets

METHOD FOR ACCESSING MEMORY BY WAY OF STEP-INCREASING THRESHOLD VOLTAGE

This application is a divisional application of U.S. application Ser. No. 11/758,802, filed Jun. 6, 2007, and entitled "Method for Accessing Memory".

BACKGROUND OF THE INVENTION

1. Field of the Invention

The invention relates in general to a method for accessing memory, and more particularly to a new method for accessing memory which saves both memory accessing time and power consumption.

2. Description of the Related Art

The memory used for storing various types of data includes a variety of types such as multi-bit cell (MBC) memory and multi-level cell (MLC) memory. Referring to FIG. 1A, a perspective of a conventional MBC is shown. As indicated in FIG. 1A, the left half cell of the MBC 100 is bit A, and the right half cell of the MBC 100 is bit B. Referring to FIG. 1B, a distribution diagram of threshold voltages of a conventional MLC is shown. The levels (level 0, level 1, level 2, level 3) are normally defined as (11, 10, 01, 00).

Examples of the memory further include the memory which integrates the MLC technology in the MBC technology. Referring to FIG. 1C, a perspective of a conventional memory cell is shown. The left half cell of the memory cell 110 includes bit A and bit B. The right half cell of the memory cell 110 includes bit C and bit D. When accessing the data stored in the memory cell 110, the memory cell 110 needs to be enabled three times by using different word line voltages for the data stored in the memory cell 110 to be correctly determined with reference to various reference voltages, not only wasting memory accessing time but also increasing power consumption.

SUMMARY OF THE INVENTION

The invention is directed to a method for accessing memory. Firstly, data are written into memory cells according to a redefined distribution of threshold voltages of memory cells and a new operation method. Next, data stored in memory cells are determined according to a simpler procedure, saving both memory accessing time and power consumption.

According to a first aspect of the present invention, a method for accessing memory is provided. The memory includes many multi-level cells each having at least a storage capable of storing 2n bits, n is a positive integer. The method for accessing memory includes the following steps: Firstly, threshold voltages of the storage are defined into $2^n$ level respectively, wherein each of the $2^n$ level corresponds to a storage status of n bits, and most significant bits of the storage statuses which level 0 to level $2^{n/2}-1$ correspond to are different from most significant bits of the storage statuses which level $2^{n/2}$ to level $2^n-1$ correspond to. Next, a target data is divided into n portions and the divided target data is written into n temporary memories respectively. Then, n bits of the target data are written into the multi-level cell. Each of the n bits data is collected from each of the n temporary memories.

According to a second aspect of the present invention, a method for accessing memory is provided. The memory includes many memory cells. The distribution of threshold voltages at each memory cell includes level 0~level 3 from low to high in order. The method for accessing memory includes the following steps: Firstly, at least one piece of data is received. Then, the threshold voltages of memory cells corresponding to level 1, level 2 and level 3 are boosted from level 0 to level 1. After that, the threshold voltages of memory cells corresponding to level 2 and level 3 are boosted from level 1 to level 2. Lastly, the threshold voltages at the memory cell corresponding to level 3 are boosted from level 2 to level 3.

According to a third aspect of the present invention, a method for accessing memory is provided. The memory includes many multi-level cells each having at least a storage capable of storing 2n bits, n is a positive integer. The method for accessing memory includes the following steps: Firstly, threshold voltages of the storage are defined into $2^n$ level respectively, wherein each of the $2^n$ level corresponds to a storage status of n bits, and least significant bits of the storage statuses which level 0 to level $2^{n/2}-1$ correspond to are different from least significant bits of the storage statuses which level $2^{n/2}$ to level $2^n-1$ correspond to. Next, a target data is divided into n portions and the divided target data is written into n temporary memories respectively. Then, n bits of the target data are written into the multi-level cell. Each of the n bits data is collected from each of the n temporary memories.

The invention will become apparent from the following detailed description of the preferred but non-limiting embodiments. The following description is made with reference to the accompanying drawings.

DETAILED DESCRIPTION OF THE INVENTION

The invention provides a method for accessing memory. Firstly, data are written into memory cells according to a redefined distribution of threshold voltages of memory cells and a new operation method. Next, data stored in memory cells are determined according to a simpler procedure which requires fewer times of enabling the word lines, saving both memory accessing time and power consumption.

Figure 1A:
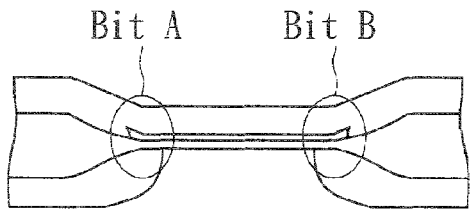
FIG. 1A (Prior Art) is a perspective of a conventional MBC.
Figure 1B:
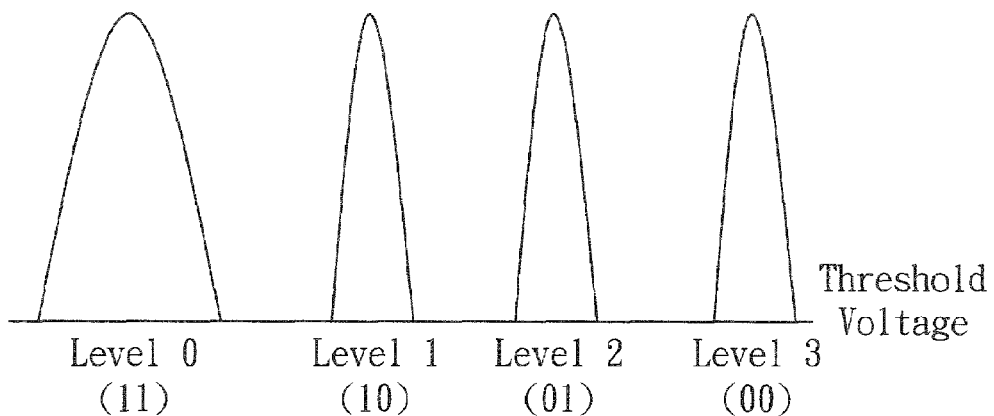
FIG. 1B (Prior Art) is a distribution diagram of threshold voltages of a conventional MLC.
Figure 1C:
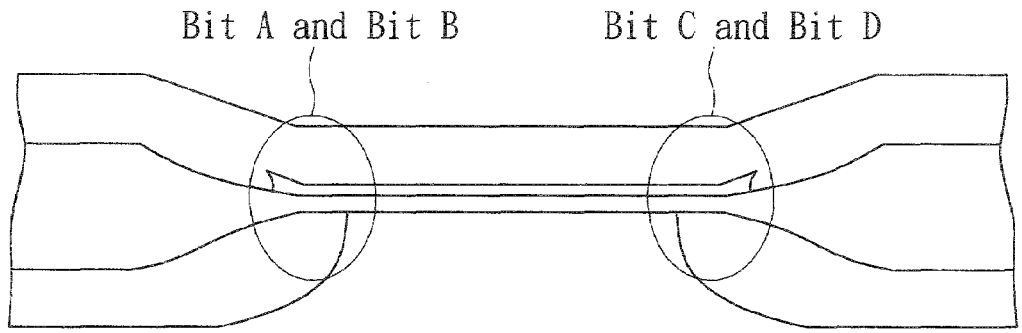
FIG. 1C (Prior Art) is a perspective of a conventional memory cell.
Figure 2:
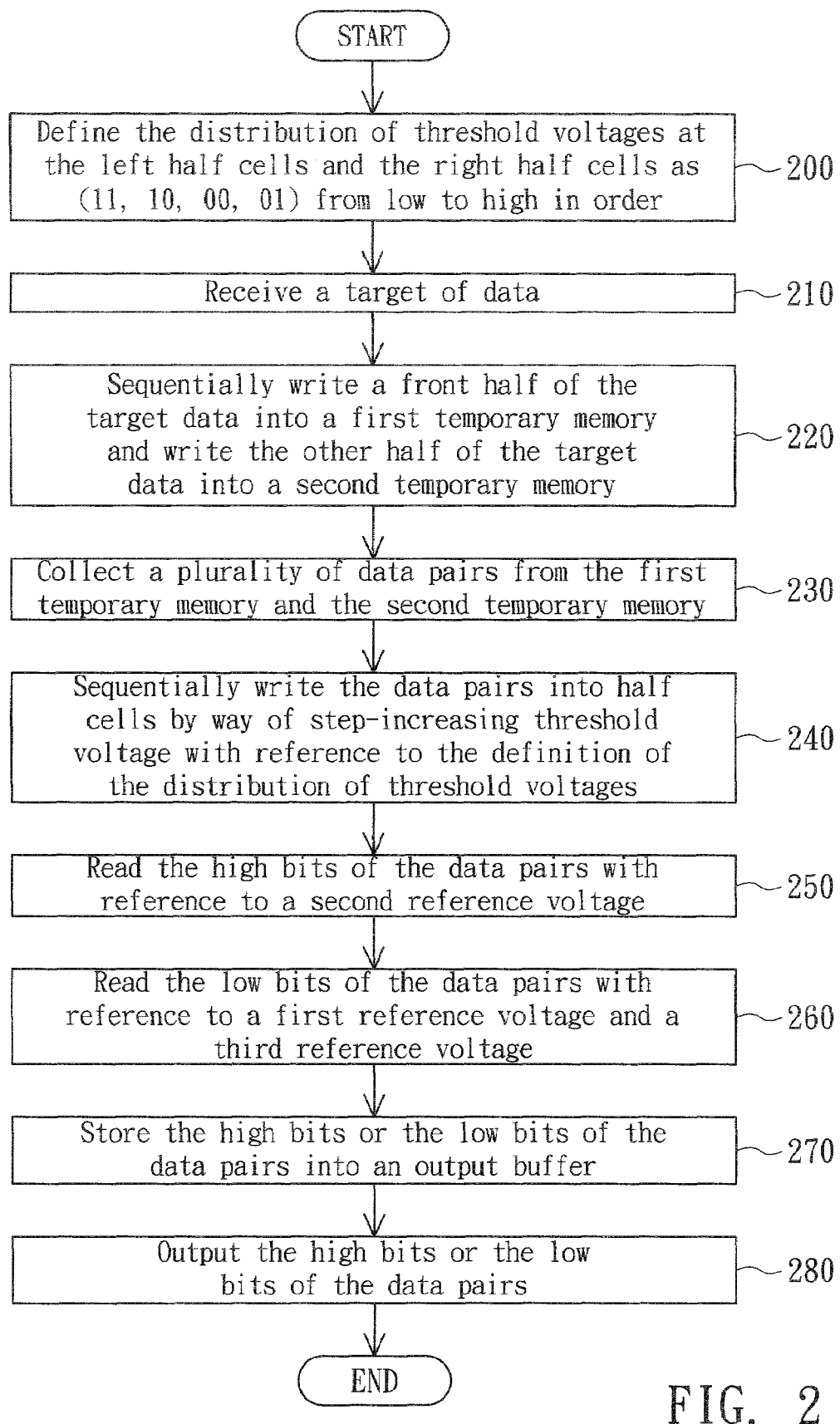
FIG. 2 is a flowchart of a method for accessing memory according to a preferred embodiment of the invention.

Referring to FIG. 2, a flowchart of a method for accessing memory according to a preferred embodiment of the invention is shown. The method for accessing memory is used in a memory such as a multi-level cell (MLC) non-volatile memory or an N-bit memory. The memory has many multi-level cells each having at least a storage capable of storing 2n bits, n is a positive integer. Take n=2 as exemplified hereinafter. Each multi-level cell substantially has a left half cell and a right half cell. Each half cell can store a data pair (2 bits). As the method shown in FIG. 2, the distribution of threshold voltages is defined as (11, 10, 00, 01) for example but is not limited thereto. In practice, for a multi-level cell capable of storing 4 bits, as long as the most significant bits (or the least significant bits) of the storage statuses which level 0 to level 1 correspond to are different from the most significant bits (or the least significant bits) of the storage statuses which level 2 to level 3 correspond to, the definition of the threshold voltages of the storage conforms with the invention, such as (11, 10, 00, 01), (11, 10, 00, 01) or (11, 10, 00, 01).

Figure 3:
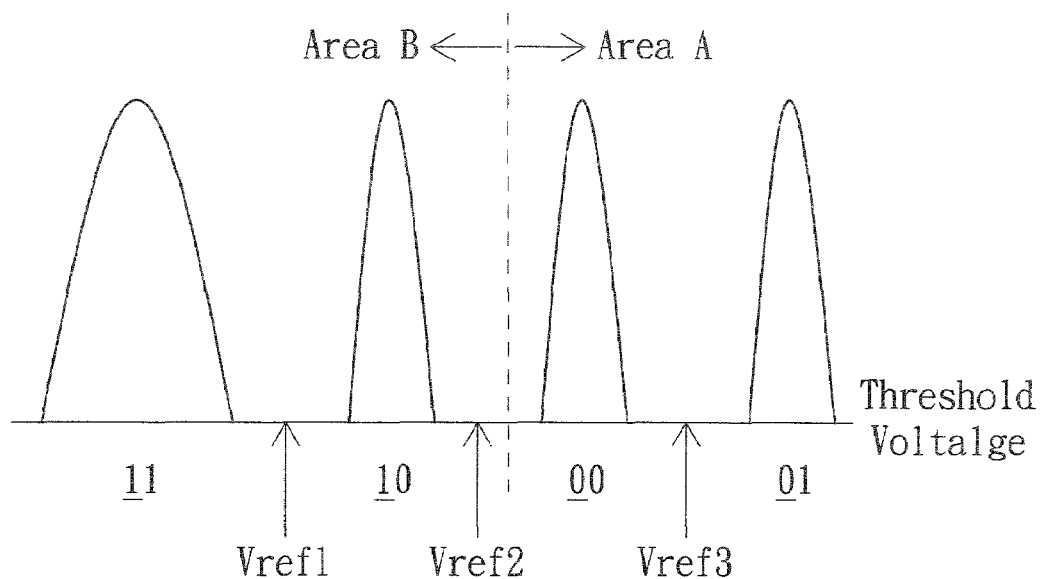
FIG. 3 is a distribution diagram of threshold voltages of memory cells according to a preferred embodiment of the invention.

Firstly, the method begins at step 200, the distribution of threshold voltages at the left half cell and the right half cell is defined as (11, 10, 00, 01) from low to high in order. Referring to FIG. 3, a distribution diagram of threshold voltages of memory cells according to a preferred embodiment of the invention is shown. As indicated in FIG. 3, all the high bits at area A are "0", and all the high bits at area B are "1". The distribution of threshold voltages is defined to make the data stored in a half cell easier to be identified, and is not limited to the above exemplification. Any definition capable of differentiating the high bits or the low bits at area A and area B will do.

The method proceeds to step 210, a target data is received, wherein the size of the target data is $2^n$ bytes, n is a positive integer, $1 \sim 2^{n-1}$ bytes are defined as a front half of the target data, and $(2^{n-1}+1) \sim 2^n$ bytes are defined the other half of the target data. If the target data is one page, then the front half is the front half page and the other half is the other half page. If the target data is two pages, then the front half is the first page, and the other half is the second page.

Figure 4:
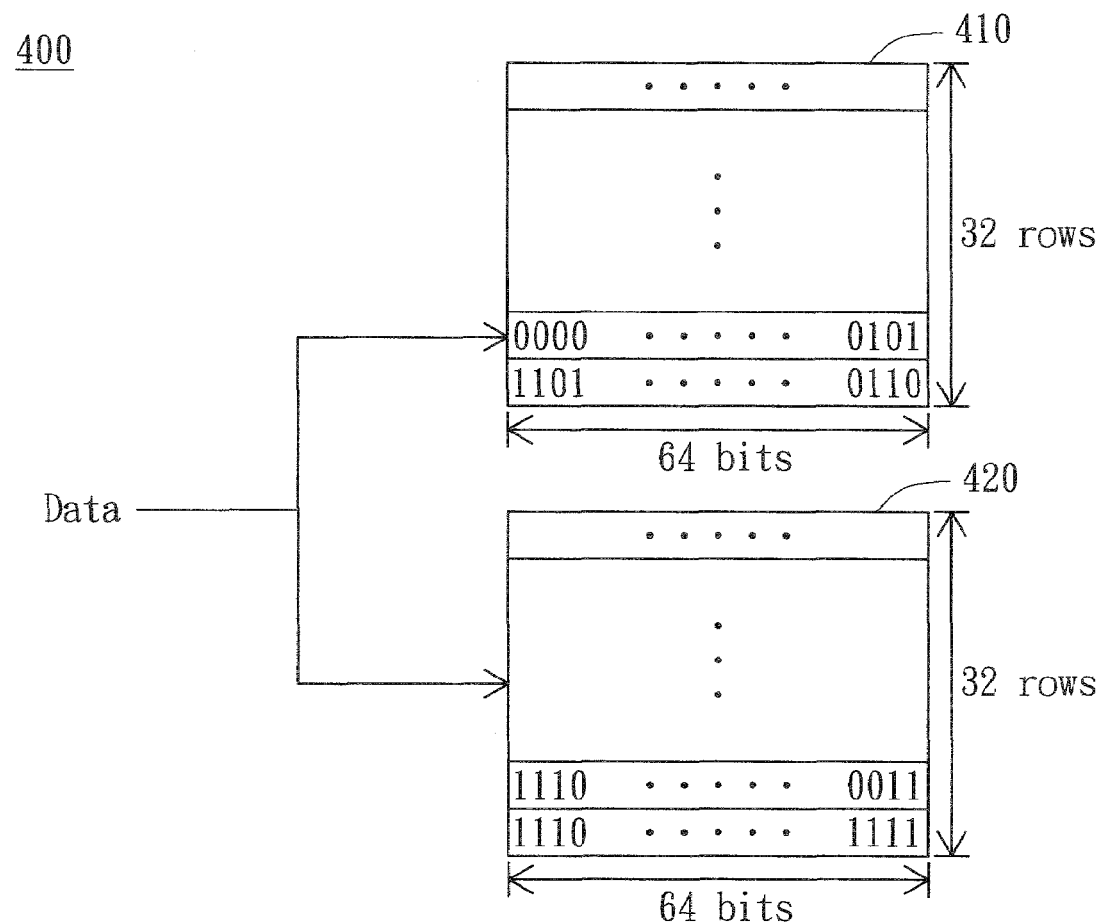
FIG. 4 is a perspective of a data input phase according to a preferred embodiment of the invention.

The method proceeds to step 220, a front half of the target data is sequentially written into a first temporary memory, and the other half of the target data is sequentially written into a second temporary memory, wherein both the first temporary memory and the second temporary memory are registers or static random access memories (SRAM) for example. The size of the target data exemplified by 512 bytes is not limited thereto. Referring to FIG. 4, a perspective of a data input phase according to a preferred embodiment of the invention is shown. In the memory 400, the front half (1~256 bytes) of the target data Data is stored in the first temporary memory 410, and the other half (257~512 bytes) of the target data Data is stored in the second temporary memory 420.

Figure 5:
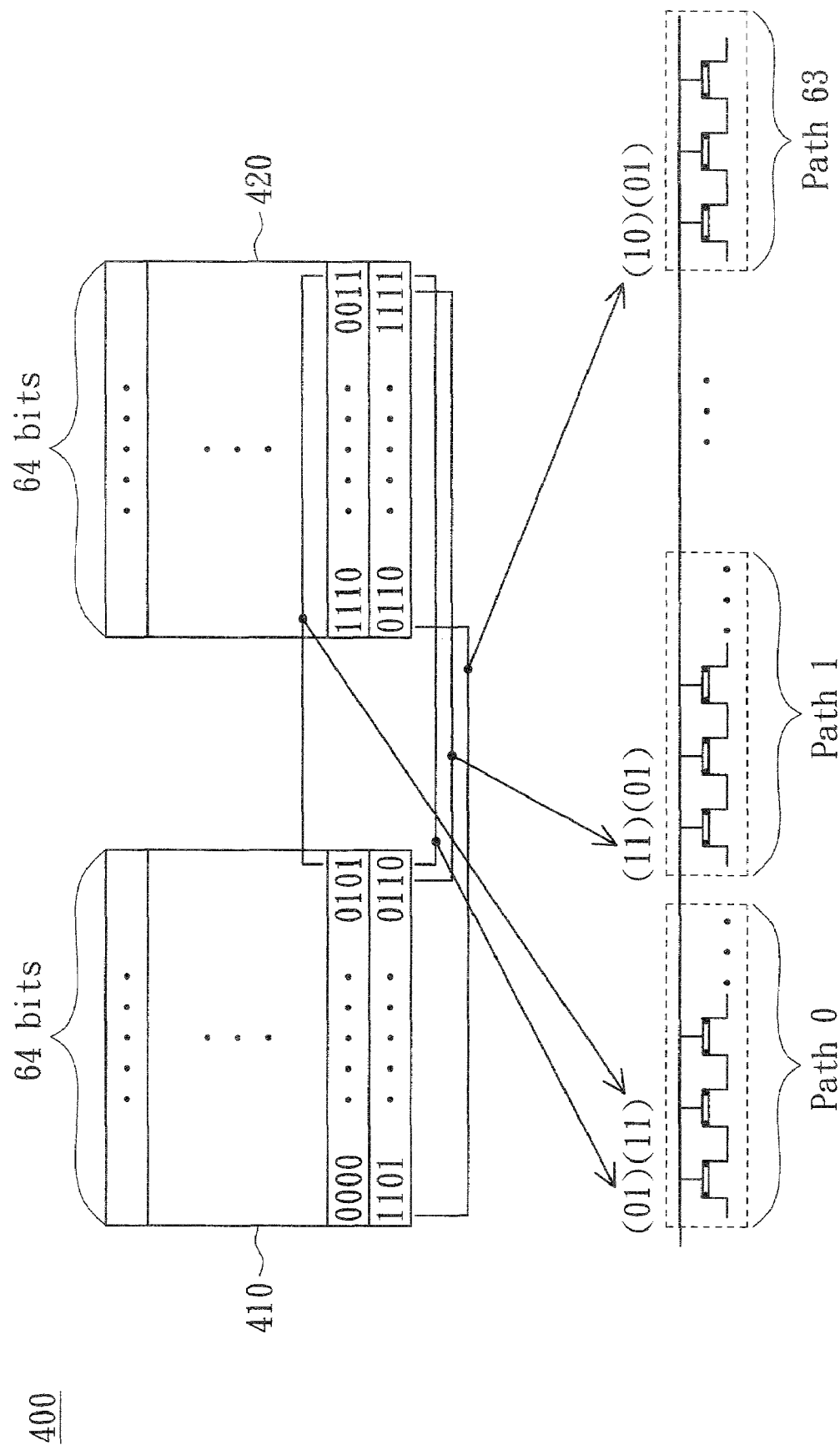
FIG. 5 is a perspective of a data pair according to a preferred embodiment of the invention.

The method proceeds to step 230, a number of high bits are collected from a front half of the target data stored in the first temporary memory, and a number of low bits corresponding to the high bits are collected from the other half of the target data stored in the second temporary memory. Next, data pairs are formed by the high bits and the low bits. Referring to FIG. 5, a perspective of data pairs according to a preferred embodiment of the invention is shown. In FIG. 5, the high bits and the low bits are respectively collected from the first temporary memory 410 and the second temporary memory 420 to form data pairs. Next, the data pairs are sequentially written into the left half cell of the first memory cell as in paths 0~paths 63 of the memory 400 first, and the right half cell of the first memory cell as in paths 0~paths 63 next. The data pairs are sequentially written in all the half cells as in paths 0~paths 63 according to the above method.

Figure 6:
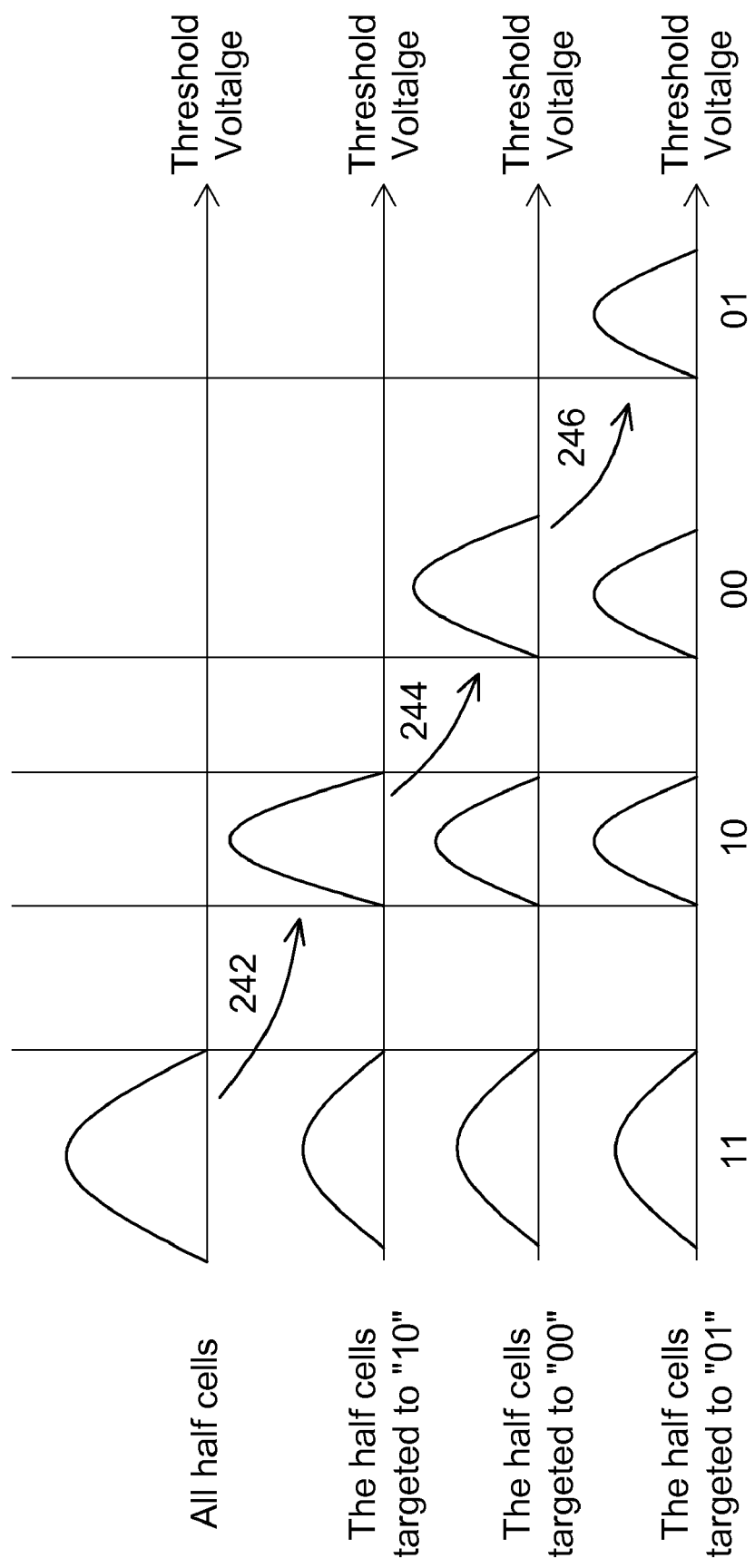
FIG. 6 is a perspective showing a method of step-increasing threshold voltage according to a preferred embodiment of the invention.

The method proceeds to step 240, according to the distribution of threshold voltages defined in step 200, many data pairs are sequentially written into the left half cells and the right half cells of many memory cells by way of step-increasing threshold voltage. Referring to FIG. 6, a perspective showing a method of step-increasing threshold voltage according to a preferred embodiment of the invention is shown. The method of step-increasing threshold voltage is indicated in FIG. 6. At an initial state, the threshold voltages at the left half cells and the right half cells of all memory cells corresponds to the level 0 (11). In step 242, the threshold voltages at half cells targeted to the levels 1~3 (10, 00, 01) are boosted from the threshold voltages corresponding to the level 0 (11) up to the threshold voltages corresponding to the level 1 (10). In step 244, the threshold voltages at half cells targeted to the levels 2~3 (00, 01) are boosted from the threshold voltages corresponding to the level 1 (10) up to the threshold voltages corresponding to the level 2 (00). In step 246, the threshold voltages at half cells targeted to the level 3 (01) are boosted from the threshold voltages corresponding to the level 2 (00) up to the threshold voltage corresponding to the level 3 (01). Compared with the conventional method which boosts the threshold voltages from a lowest level, the threshold voltages according to the way of step-increasing threshold voltage are boosted to a higher level in advance as indicated in FIG. 6, hence saving a considerable amount of time.

The method proceeds to step 250, the high bits of the data pairs are read with reference to the second reference voltage. The method proceeds to step 260, the low bits of the data pairs are read with reference to the first reference voltage and the third reference voltage. Referring to FIG. 3, wherein the first reference voltage $V_{ref1}$ is smaller than the second reference voltage $V_{ref2}$, the second reference voltage $V_{ref2}$ is smaller than the third reference voltage $V_{ref3}$, and the first reference voltage $V_{ref1}$, the second reference voltage $V_{ref2}$ and the third reference voltage $V_{ref3}$ are used for differentiating the threshold voltage of different levels and determined substantially by the distribution of the threshold voltages defined in the step 200. When the threshold voltage of the half cell is larger than the second reference voltage $V_{ref2}$, the high bit of the data pair stored in the half cell is "0". Meanwhile, if the threshold voltage of the half cell is larger than the third reference voltage $V_{ref3}$, then the low bit of the data pair stored in the half cell is "1", and the data pair stored in the half cell is "01"; if the threshold voltage of the half cell is smaller than the third reference voltage $V_{ref3}$, then the low bit of the data pair stored in the half cell is "0", and the data pair stored in the half cell is "00".

When the threshold voltage of the half cell is smaller than the second reference voltage $V_{ref2}$, the high bit of the data pair stored in the half cell is "1". Meanwhile, if the threshold voltage of the half cell is larger than the first reference voltage $V_{ref1}$, then the low bit of the data pair stored in the half cell is "0", and the data pair stored in the half cell is "10"; if the threshold voltage of the half cell is smaller than the first reference voltage $V_{ref1}$, then the low bit of the data pair stored in the half cell is "1", and the data pair stored in the half cell is "11".

Figure 7:
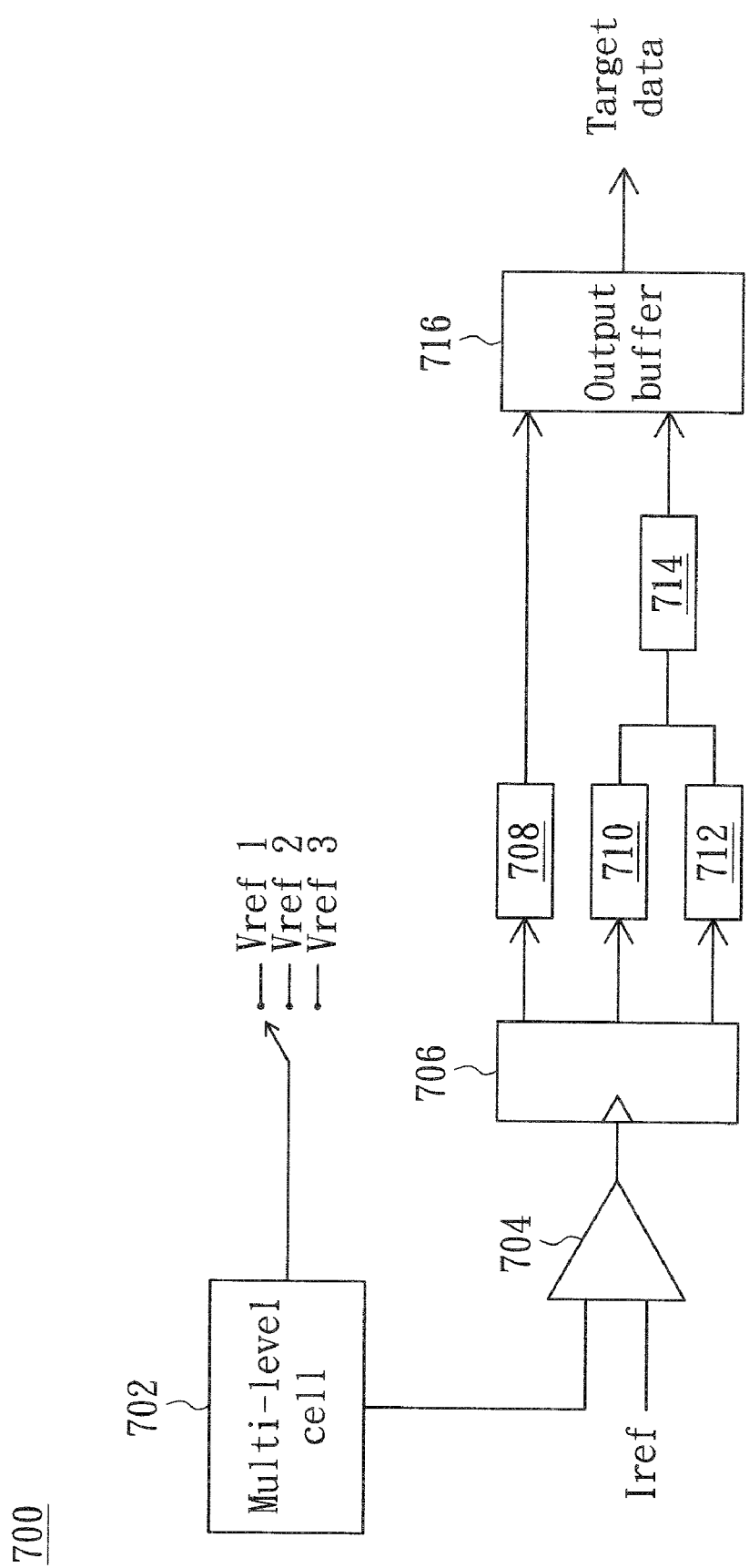
FIG. 7 is a circuit diagram of a scan read circuit according to a preferred embodiment of the invention.

The above reference voltages $V_{ref1} \sim V_{ref3}$ are substantially obtained by enabling the word line corresponding to the memory cell. According to the distribution of threshold voltages defined in step 200, in steps 250~260, the high bits of the data pairs are read by enabling the word line once, and the low bits of the data pairs are read by enabling the word line twice. Compared with the conventional method which requires the word line to be enabled for three times, the method according to the present embodiment of the invention only requires the word line to be enabled twice, not only saving a considerable amount of time and also reducing power consumption. FIG. 7 is a circuit diagram of a scan read circuit according to a preferred embodiment of the invention. Referring to FIG. 7, step 250 to 280 can be implemented by the scan read circuit 700 substantially. The scan read circuit 700 may be replaced by other circuits capable of enabling the word line onece to read the high bits of the data pairs and enabling the word line twice to read the low bits of the data pairs. In addition, corresponding to different definitions of the threshold voltage, the scan read circuit 700 is changed and not limited thereto.

When one user wants to read the high bit of a data pair, the word line of the multi-level cell 702 is enabled by the second reference voltage $V_{ref2}$ and the high bit of the data pair is read by the sense amplifier 704 and is stored into the temporary memory 708 by the logic gate 706. When the user wants to read the low bit of the data pair, the word line of the multi-level cell 702 is enabled by the first reference voltage $V_{ref1}$ and the result read by the sense amplifier 704 is stored into the temporary memory 710 by the logic gate 706. Then the word line of the multi-level cell 702 is enabled by the third reference voltage $V_{ref3}$ and the result read by the sense amplifier 704 is stored into the temporary memory 712 by the logic gate 706. Afterwards the low bit of the data pair is determined according to Table 1 and is stored in the temporary memory 714. Table 1 is a scan read table according to a preferred embodiment of the invention. In Table 1, "X" means don't care.

TABLE 1

| | | | |
|---|---|---|---|
| Temporary memory 710 | 0 | 0 | 1 |
| Temporary memory 712 | 0 | 1 | X |
| Temporary memory 714 | 1 | 0 | 1 |

Next, the method proceeds to step 270, the high bits or the low bits of the data pairs are stored in an output buffer 716. Lastly, the method proceeds to step 280, the high bits or the low bits of the data pairs are outputted.

A method for accessing memory is disclosed in the above embodiments of the invention. Firstly, data are written into the left half cell and the right half cell of memory cells according to a redefined distribution of threshold voltages of memory cells and a new operation method of step-increasing threshold voltage. Then, data stored in the half cells of memory cells are determined by enabling the word lines for fewer times, saving both memory accessing time and power consumption.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for accessing a memory, wherein the memory comprises a plurality of memory cells, the distribution of threshold voltages at each memory cell comprises level 0~level 3 from low to high in order, the method for accessing memory comprises:

receiving at least one piece of data;

boosting the threshold voltages of the memory cells targeted to the level 1, the level 2 and the level 3 from the threshold voltages corresponding to the level 0 to the threshold voltages corresponding to the level 1;

boosting the threshold voltages of the memory cells targeted to the level 2 and the level 3 from the threshold voltages corresponding to the level 1 to the threshold voltages corresponding to the level 2; and boosting the threshold voltages of the memory cells targeted to the level 3 from the threshold voltages corresponding to the level 2 to the threshold voltages corresponding to the level 3.

2. The method for accessing a memory according to claim 1, wherein the memory is an N-bit memory.

* * * * *